June 28, 1960 E. P. G. WRIGHT ET AL 2,942,332

MOUNTING ARRANGEMENTS FOR COMPONENTS OF ELECTRICAL CIRCUITS

Filed Jan. 12, 1953 5 Sheets-Sheet 1

Inventor
E. P. G. WRIGHT – C. PARKER

By [signature]

Attorney

MOUNTING ARRANGEMENTS FOR COMPONENTS OF ELECTRICAL CIRCUITS

Inventor
E. P. G. WRIGHT – C. PARKER
By [signature]
Attorney

June 28, 1960 E. P. G. WRIGHT ET AL 2,942,332

MOUNTING ARRANGEMENTS FOR COMPONENTS OF ELECTRICAL CIRCUITS

Filed Jan. 12, 1953 5 Sheets-Sheet 3

Inventor
E. P. G. WRIGHT – C. PARKER

By

Attorney

MOUNTING ARRANGEMENTS FOR COMPONENTS OF ELECTRICAL CIRCUITS

Filed Jan. 12. 1953 5 Sheets-Sheet 4

Inventor
E. P. G. WRIGHT – C. PARKER
By [signature]
Attorney

*Inventor*
E. P. G. WRIGHT – C. PARKER
By [signature]
*Attorney*

United States Patent Office 2,942,332
Patented June 28, 1960

2,942,332

MOUNTING ARRANGEMENTS FOR COMPONENTS OF ELECTRICAL CIRCUITS

Esmond Philip Goodwin Wright and Cecil Parker, London, England, assignors to International Standard Electric Corporation, New York, N.Y.

Filed Jan. 12, 1953, Ser. No. 330,686

6 Claims. (Cl. 29—155.55)

The present invention relates to mounting arrangements for electrical wires and the like and to mounting and wiring arrangements for electrical components such as components which are commonly called wire-ended components.

Electronic circuits commonly comprise a comparatively large number of relatively small wire-ended components such as resistances, condensers and rectifiers, intimately connected.

One object of the invention is the provision of an economical and compact mounting arrangement whereby large numbers of miniature components can conveniently be mounted in close proximity without detriment to their wiring or accessibility.

One feature of the invention comprises an electrical equipment panel comprising a sheet of thermoplastic material (e.g. that sold under the registered trademark "Perspex") with electrical components mounted on the surface thereof and secured thereto solely by wires which have been embedded end-first into the thermo-plastic material and around which the material has solidified.

Another feature of the invention comprises a method of mounting electrical wires in arbitrarily selected positions in the surface area of an insulating panel in which each wire is entered end-first into or through said panel while the panel material at the position of entry is soft.

The term electrical wires include wires of any cross-sectional shape such as round or rectangular and similarly includes conductors and terminals such as are used for mounting or making connection to electrical components of the kinds described.

By the end of a wire is meant the point of a substantially straight wire or the end of a loop formed by bending a wire back upon itself to form an open or closed loop of wire.

Panel material may comprise an insulating material having the property of setting by polymerisation or otherwise at normal room temperature and preferably, but not necessarily, a thermo-plastic material which softens after setting when heated as by a hot soldering iron heated to within the range at which normal soft-soldering operations are performed, is used in carrying out the invention. It has been found that a thermo-plastic material comprising polymethyl methacrylate, e.g. that sold under the registered trade-mark "Perspex" and substantially unplasticised is particularly suitable for such use.

The invention will be fully understood from the following description of a number of embodiments thereof read in conjunction with the accompanying drawings in which:

Fig. 1 shows a typical wire-ended component;

Figs. 2, 4, 16, 17, 18, 19, 20 relate to various methods of forming and preparing wires of components, while Figs. 3, 5, 7, 8, 9, 12, 13, 14, 15, 21, 22, 23, 32, 33 relate to various methods of mounting components having their wires so formed and prepared;

Figures 1, 2, 3, 4, 5:
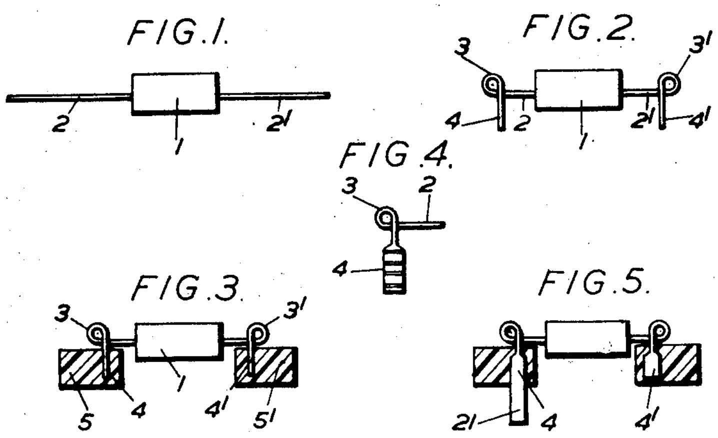

Referring now to Fig. 1, wire-ended components have body portions, such as 1, which may comprise a condenser or a resistance or other electrical circuit component and which may vary in length and cross-section, and wire ends such as 2, 2', which may be substantially in line with one another and extend from the body portion 1 in opposite directions, as shown, or may comprise parallel wires both extending from the body in the same direction.

In order to mount such a component the wire ends 2, 2' may be prepared in one of several possible ways such as by forming loops 3, 3' (Fig. 2) at convenient distances from the body portion 1 with the ends 4, 4' substantially at right angles to the portions 2, 2'. The ends 4, 4' may be flattened and roughened as shown in Fig. 4 and furthermore may be formed into a hook as shown at 25 in Fig. 16 or into a complete loop, for purposes which will be later described.

Figures 16, 17, 18, 19, 20, 21, 22, 23, 24, 24A, 25, 26, 27:
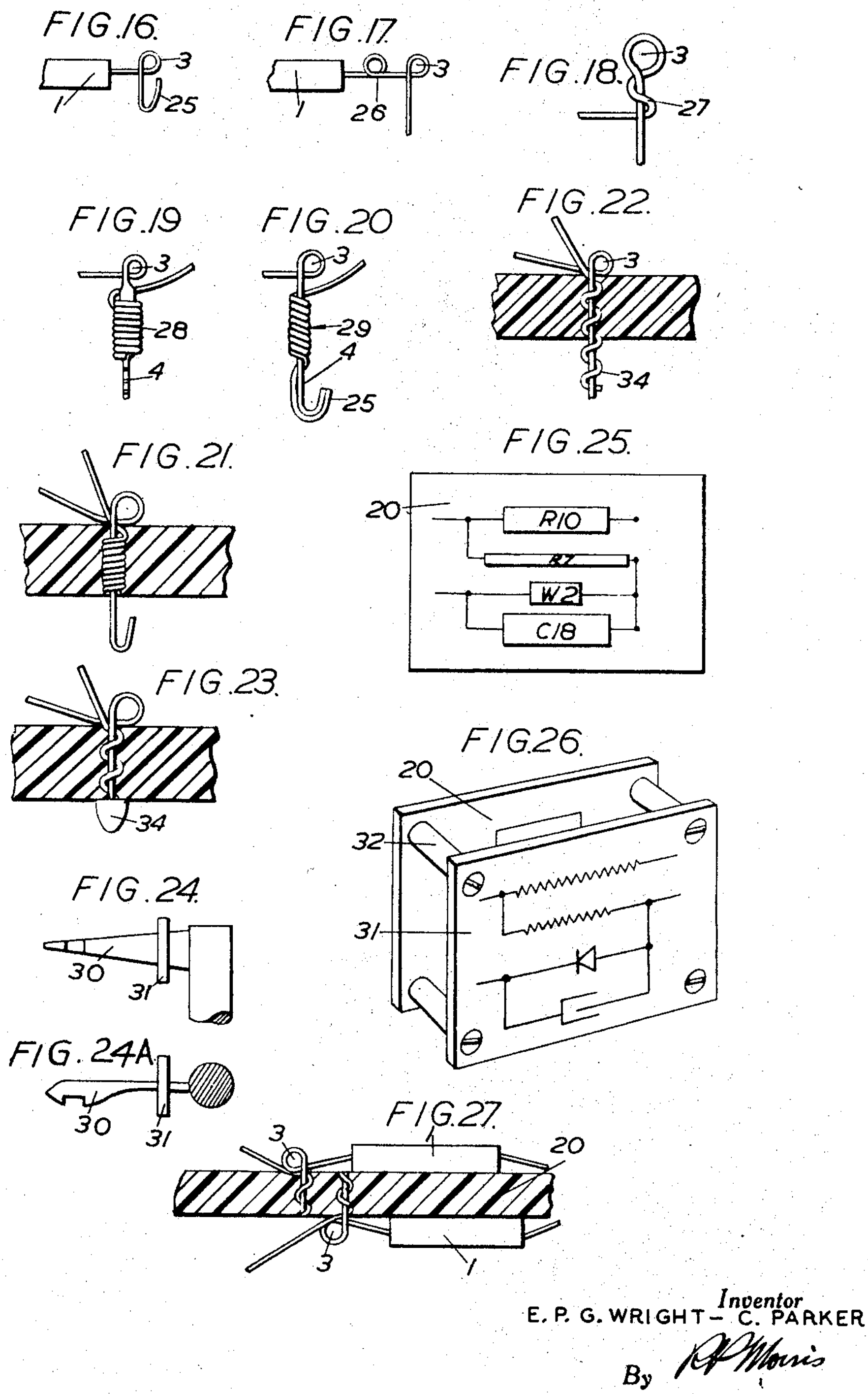
Fig. 24 shows in elevation and plan a part of a tool which will be described.
Fig. 24A shows in elevation a part of the tool shown in Fig. 24.
Fig. 25 shows a mounting base having component designation, location and strapping information thereon.
Fig. 26 shows a superposed circuit mounting.
Fig. 27 shows a double-sided mounting arrangement.

In order to maintain a predetermined minimum length of wire between the body 1 and the loop 3 to which, as will be later described, heat may be applied and to maintain the loop 3 at a distance less than said predetermined minimum length from the body 1, a loop 26 as shown in Fig. 17 may be made in the wire between the loop 3 and the body 1. In cases where the gauge of the wire is such that the weight of the component is likely to shake the loop 3 undone when under service conditions, the loop 3 may be formed with an extra turn as shown at 27 in Fig. 18. Further preparation of the wire ends may be made by the attachment of a connecting or strapping wire as shown in Fig. 19 in which a wire 28 is shown tightly and closely wrapped around the end 4 of the wire close to the loop 3 or as shown in Fig. 20 in which a wire 29 is shown tightly wrapped around the end 4 which is provided with the hook 25 and which has been previously prepared by forming into a substantially rectangular cross-section.

Having prepared the wires of a component in one of the ways already mentioned, or in any other suitable manner, the component is mounted by pushing or pulling the wire ends into or through a thermo-plastic mounting base in a manner to be described.

Wires prepared as shown in Fig. 2 or 4 are caused to enter into the thermo-plastic sheet or strip while the thermo-plastic material at or around the point of entry is in plastic condition. For example, it has been found that with wire ends composed of 20 S.W.G. copper wire, the application to a loop 3 of an ordinary soldering iron heated to soldering temperature is sufficient to heat the end 4 and press it into a sheet of acrylic ester plastic, e.g. polymethyl methacrylate. The end 4 is placed on the surface of the sheet and at right angles thereto. The heat from the soldering iron flowing from the loop 3 to the end and softens the sheet and pressure applied by the soldering iron forces the end 4 into the sheet until stopped by the loop 3 reaching the surface of the sheet. Direct application of heat to the loop 3 may be avoided by making a pilot hole in the thermo-plastic by means of a hot wire or pin and inserting the end 4 in the pilot hole thus made, after withdrawing the hot wire, using such pressure as may be necessary to cause the end 4 to enter the pilot hole while the thermo-plastic around the pilot hole is still in a plastic condition from the heat of the hot wire. When the thermo-plastic sets, it contracts around the end 4 and holds the end 4 securely in position. The other end 4′ is similarly treated so that the component and its wire ends take up a position generally as shown in Fig. 3, in which 5, 5′ represent, in section, thermo-setting material such as an acrylic ester either in the form of two-strips or of a single piece which may be suitably mounted, before or after the mounting of the component thereon as shown for instance in Fig. 6 where two strips 5, 5′ are rigidly held between bars or rails 6, 6′.

Figure 7:
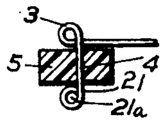

As shown in Fig. 4, the ends 4, 4′ may be flattened and may be serrated or roughened to improve their anchorage in the thermo-plastic. The lengths of the ends 4, 4′ may be such that they pass right through the thermo-plastic. An example of this is shown in Fig. 5 in which flattened ends are shown, the end 4 having an extension 21 which may be used for making electrical connections as will be described later. The end 21 may also be formed into a loop 21*a* on the under side of the base as shown in Fig. 7. The loops 3 and 21*a* may closely embrace the mounting base 5 to act as stops and maintain the location of the wire in the sheet.

Figure 32:
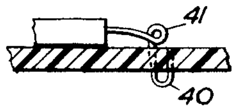

A wire formed as described in conjunction with Fig. 16 may be pulled into a thermo-plastic base in the following manner. A heated iron or similar device having a pointed metal hook attached thereto as shown at 30 in Figs. 24 and 24A is heated to about normal soldering temperature and the point of the hook pushed through the thermo-plastic from the under-side. Preferably the pointed metal hook is provided with a lip on both sides of the hook opening to obviate any tendency for thermo-plastic material to enter the opening. The hook 25 in the wire 2 (Fig. 16) is attached to the hook 30 and is drawn back through the hole made by the hook 30 while the surrounding thermo-plastic is still soft, thus forming a terminal. The hook 25 may be left with both legs firmly held in the plate, as 40 in Fig. 32, in order to anchor the wire in the plate. The loop 40 may furthermore be used for wiring on one side of the thermoplastic and loop 41 (Fig. 32) as a test point on the component side.

A suitable collar 31 (Fig. 24) may be attached to the hook 30 to limit the distance the hook 30 can be pushed through the thermo-plastic.

In another arrangement the hook 25 (Fig. 16) may be formed into a loop, as 21*a* in Fig. 7, or may be cut off flush with the surface of the thermo-plastic or may be used in any convenient manner for the attachment of a strapping or lead out wire such as by twisting together or soldering or both. During a soldering operation the loop 3 serves to increase the path along which heat can be conducted to the component and thereby reduces the risk of damage by heat to the component.

Tape ended components can be mounted in similar manner by the methods described.

Figure 33:
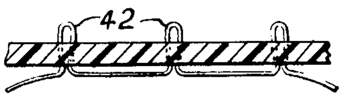

A further method is to form loops 42 or ends or terminals in an interconnecting conductor and to draw or push these loops or ends through the thermo-plastic as shown in Fig. 33 in such manner that the terminals so formed enable the components to be attached thereto.

A component which has been mounted according to the last described method may be easily replaced in obvious manner. A component mounted according to one of the other methods described may be replaced by cutting the wires 2, 2′ to remove the component and attaching the replacing component to loops 3, 3′ with or without soldering.

Figure 6:
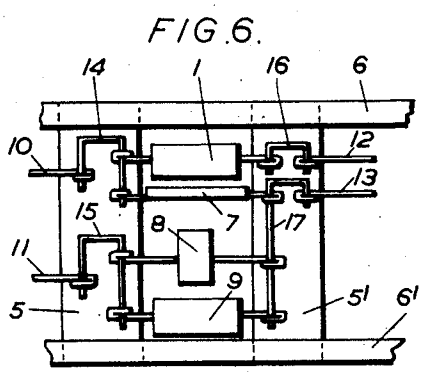
Figs. 6, 10 show mounting arrangements for components.
Figure 8:
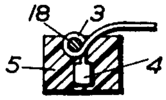

Turning now to methods of making electrical connections to components, one method is shown in Fig. 6. Components 1, 7, 8, 9 are shown secured to thermo-plastic strips 5, 5′ by one of the methods already described as also are leads 10, 11, 12, 13 which may be the wires of other components. Wiring consisting of straps or other electrical conductors 14, 15, 16, 17 are threaded through the various loops in the various component wires and lead out wires to form the circuit arrangement desired and may be soldered thereto. As shown in section in Fig. 8 the loops 3 having a strap wire such as 18 therethrough, may be embedded in the thermo-plastic 5 with or without previous soldering, by the application of heat and pressure to the loop 3, as already described. This forms an adequate electrical connection for certain purposes.

Figure 9:
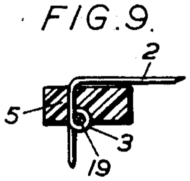

In another embodiment of the invention, loops 3 are formed after the wires have been passed through a mounting base. Such an arrangement is shown in section in Fig. 9 in which wire 2 after being inserted through thermo-plastic base 5 in a manner already described is formed on the under side with a loop 3 which may be pushed or drawn back into the base 5 after insertion or attachment of a connecting wire 19 with or without soldering.

Figure 10:
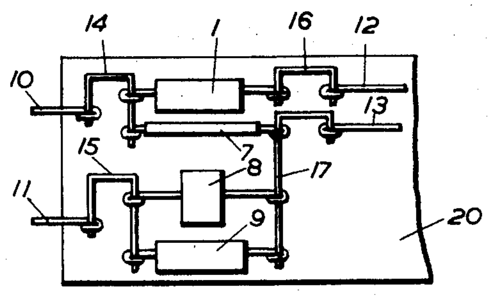
Figure 11:
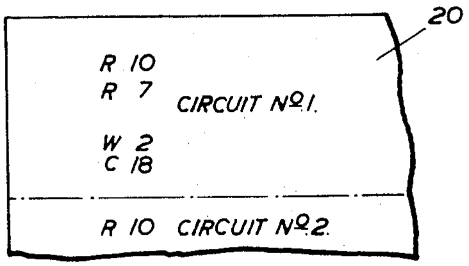
Fig. 11 shows a mounting base having component designation thereon.

In yet another embodiment of the invention the thermo-plastic material comprises a sheet of thermo-plastic as shown at 20 in Figs. 10 and 11 and which may be printed or engraved on either or both sides with information such as circuit details, component and wiring information and the like. Both wire ends of each component of a circuit are pushed or pulled into the same sheet of thermo-plastic in any of the ways described above. For example, the circuit arrangement shown in Fig. 6 is shown also in Fig. 10, the strips 5, 5′ and their rails 6, 6′ being replaced by the sheet 20 which may be prepared by printing as in Fig. 11 which shows component identifications or as in Fig. 25 which shows in addition to component identifications and the locating and strapping or inter-connecting information. Such arrangements render the marking of individual components unnecessary. Locating information may also be in the form of dents or pilot holes positioned to indicate where wires are to be passed through the thermo-plastic sheet.

In addition to or in lieu of printing or engraving on the sheet 20 a separate sheet may be superposed thereon bearing the desired information. Such an arrangement is shown in Fig. 26 which shows a circuit printed on a thermo-plastic sheet 31 in such manner that when mounted by pillars 32 upon sheet 20 the symbols indicate the functions of the components immediately behind them on sheet 20. Furthermore the sheet 31 may comprise a circuit drawing adhesively attached thereto and may comprise cut-out portions where it is desirable to be able to see or to reach components mounted on the sheet 20. While the sheet 31 is shown mounted on pillars 32 it may be mounted or hung in any convenient manner and may carry insignia providing any desired information. This arrangement may also be extended to display a functional diagram which is secured or hinged in front of operative apparatus in such manner as to be associated therewith, thus indicating the circuit operation.

Figures 28, 29:
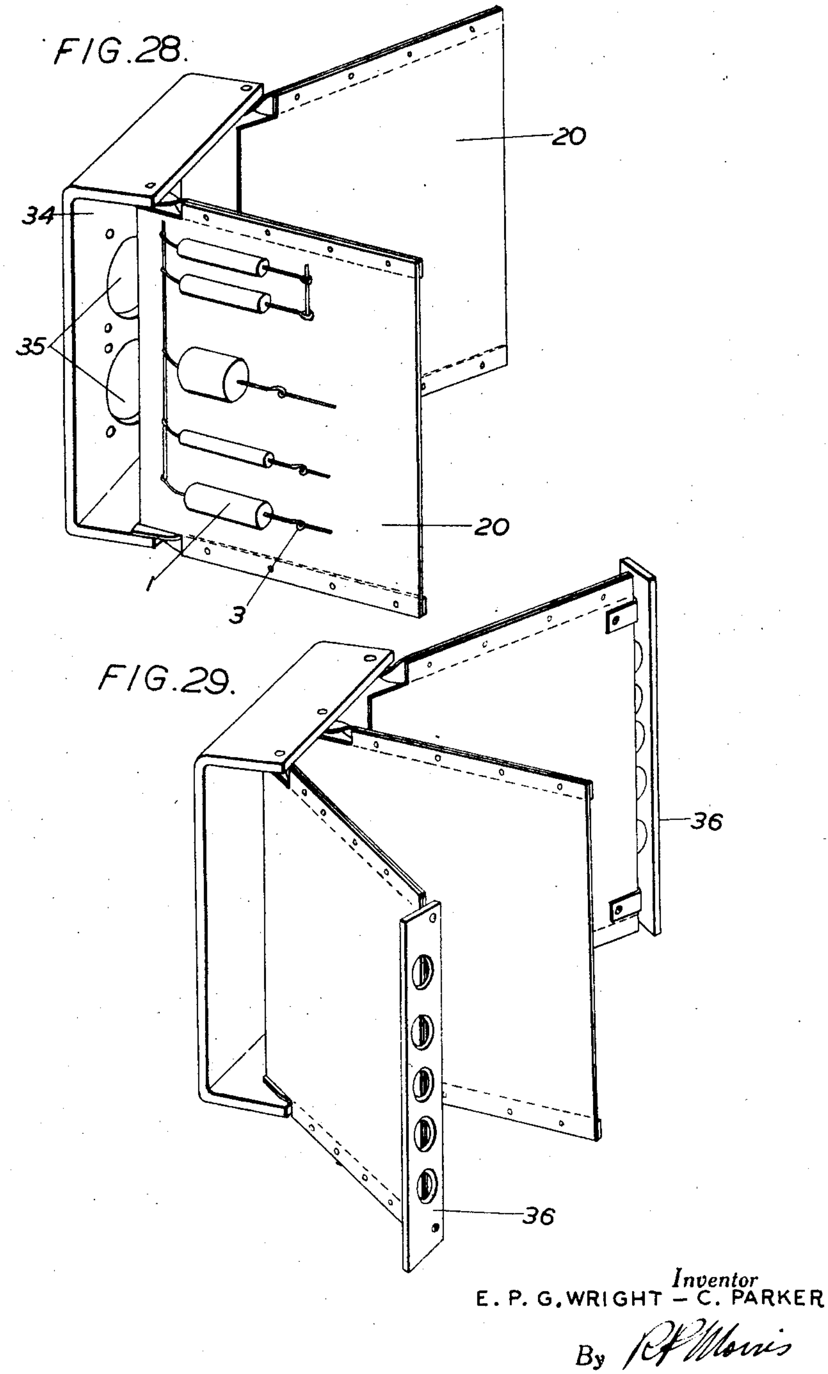
Figs. 28 and 29 show assembly units having components and thermionic valves mounted thereon.

For instance a diagram may be mounted in conjunction with an assembly unit of the type shown in Fig. 28. In such an arrangement certain components are arranged on one face of a vertically-mounted mounting-plate such as 34 and other components are mounted on equipment panels arranged as sub-assemblies mounted in depth from the other face of the mounting plate. In front of the components mounted on the mounting plate there may be mounted a diagram plate which will preferably be mounted vertically and parallel with the mounting plate. The diagram plate may be transparent or opaque as required and may have suitable cut-outs whereby components may be seen or reached through the plate and may carry insignia of two types, a first type being individual to and physically in front of the components to which they relate on the mounting plate and a second type being broadly functional and each common to a sub-assembly (or a sub-sub-assembly or a group of sub-assemblies) arranged in depth on the equipment panels behind. The circuitry between the insignia may also be shown.

A further method of making electrical connections with components is shown in Figs. 12 to 15.

Figure 12:
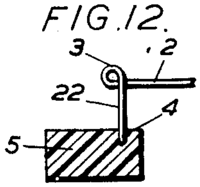
Figure 13:
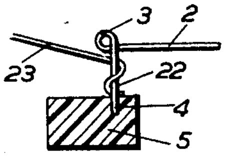
Figure 14:
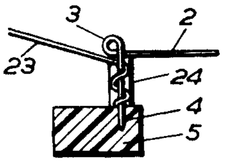

Referring first to Fig. 12 the wire end 4 is embedded, as already described, in thermo-plastic such as strip 5, leaving a portion 22 around which there is twisted, as shown in Fig. 13, a connecting wire such as 23. As shown in Fig. 14, the contacting portions of the wires 22 and 23 are coated, as by painting, with a conducting material such as cold solder or with paint or enamel or first with cold solder and then with paint or enamel, thus forming a single or double coating 24. This coating 24, if done with a conducting material, such as cold solder, serves to improve the electrical interconnection between the wire 23 and the portion 22 of the wire end 2, while the application of paint or enamel serves to prevent the ingress of moisture or atmosphere to the joint.

Figure 15:
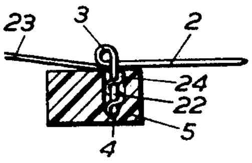

Having performed the coating operation or operations, the wire end 4 is further pressed in, in a manner already described, until the connection assumes the position shown in Fig. 15. Other known safeguards can also be incorporated to ensure conductivity.

As shown in Fig. 27, components may be mounted on both sides of a sheet of thermo-plastic by one of the methods already described.

A component wire end prepared and connected as described in connection with Fig. 19 or Fig. 20 may be pushed or pulled into thermo-plastic as shown in Fig. 21 or Fig. 22 and the hook 25 or the protruding ends 34 may be cut off. In order to improve the electrical connection between a component wire end and a wire which has been connected to it the ends 34 may be suitably trimmed and then soldered together as shown in Fig. 23. A number of such connections on the same side of a thermo-plastic panel may be fluxed and soldered by fluxing the ends 34 and dipping into a bath of molten solder.

Figure 30:
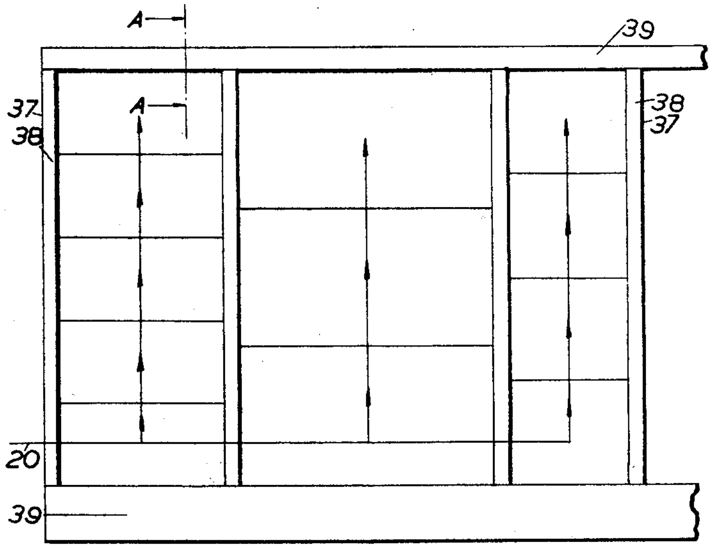
Fig. 30 shows a rack mounting.
Figure 31:
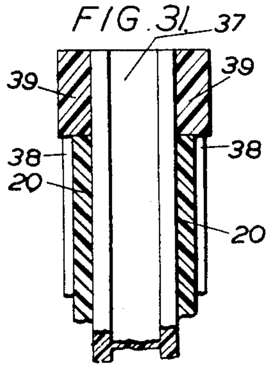
Fig. 31 is an enlarged sectional view taken along the line A—A in Fig. 30 in the direction of the arrows.

Thermo-plastic sheets or panels equipped with circuit components in a manner described may be pivoted side by side on one side of a mounting plate which carries on its other side thermionic valves and other apparatus. Such an assembly unit is shown in Fig. 28 in which two panels 20 are pivoted at one side of a vertical mounting plate 34 which is drilled at 35 for the mounting of sockets for valves so that when valves are plugged into the sockets they will project from the plate 34 from the opposite side to that from which the panels 20 project. Maintenance of equipment mounted in this manner involves the disadvantage of requiring access to both sides of the racks on which the assembly units are carried. This disadvantage may be overcome by mounting the sockets for valves or other major equipment components on plates or mounting strips attached to the free ends of the thermo-plastic panels as shown in Fig. 29 in which valve socket plates 36 are shown mounted on alternate panels, it being assumed that the circuit to be mounted on the intermediate panel is such that no valve socket plate is required therefor. In another arrangement, however, thermo-plastic sheets or panels equipped with circuit components in a manner described are formed into single or double-sided racks consisting of, for example, H or I section uprights tied together at the top and bottom by horizontal members. Such an arrangement is shown in Figs. 30 and 31 in which panels 20, which may vary in at least one dimension according to the number and size of the components to be mounted thereon, are placed between uprights 37 and held in position by stile strips 38, or by other known devices, the uprights being connected together by horizontal members 39. Such an arrangement is cheap and easy to construct since relatively thin thermoplastic sheets in a comparatively light framework structure are capable of carrying many components mounted very close together in a manner described.

While the principles of the invention have been described above in connection with specific embodiments, and particular modifications thereof, it is to be clearly understood that this description is made only by way of example and not as a limitation on the scope of the invention.

What we claim is:

1. A method of mounting electrical wires in arbitrarily selected positions in the surface area of an insulating panel of thermoplastic material in which each wire is entered end first into said panel while the panel material is locally softened by heat at the portion of entry and each of said wires is pulled into said panel by a tool the end of which has been previously passed through said panel.

2. A method of mounting as claimed in claim 1, and in which the heat is applied to the panel by said tool.

3. A method of mounting as claimed in claim 1, in which a stop comprising a loop is integrally formed in each wire prior to passage into said insulating panel whereby the extent of movement into or through said panel is determined by said stop.

4. A method of mounting as claimed in claim 1, and in which a connecting wire is applied in contact relation to one of said electrical wires and the point of contact between said wires is passed into said panel whereby a firm connection between said wires is obtained.

5. A method of mounting as claimed in claim 1, in which said wire is passed right through said panel, a curved portion being formed in said wire, passing said portion through said panel and adjacent the opposite side thereof, passing a connecting wire through said portion, and partly forcing said portion back into said panel to create a firm contact between said portion and said connecting wire.

6. A method of mounting an electrical terminal wire having a loop formed therein a given distance from an end thereof, in a sheet of thermoplastic material by local softening of the sheet, comprising heating a tool to a temperature sufficient to cause local softening of said thermoplastic material, piercing said thermoplastic material with said tool, attaching said wire to said tool, drawing said terminal wire into the hole made by the tool as the tool is withdrawn, until said loop abuts thereagainst and forming a second loop in said terminal wire in the portion which has been drawn through said hole whereby said second loop serves as a terminal for further connection thereto.

References Cited in the file of this patent

UNITED STATES PATENTS

| | | |
|---|---|---|
| 2,163,071 | Stringer | June 20, 1939 |
| 2,431,208 | Stone et al. | Nov. 18, 1947 |
| 2,466,192 | Wood | Apr. 5, 1949 |
| 2,474,988 | Sargrove | July 5, 1949 |
| 2,533,483 | Losquadro | Dec. 12, 1950 |
| 2,596,237 | Gross | May 13, 1952 |
| 2,651,833 | Kernahan | Sept. 15, 1953 |
| 2,671,264 | Pessel | Mar. 9, 1954 |
| 2,679,913 | Scott | June 1, 1954 |

FOREIGN PATENTS

| | | |
|---|---|---|
| 519,952 | Great Britain | Apr. 10, 1940 |
| 639,453 | Great Britain | June 28, 1950 |